(12) United States Patent
Kido

(10) Patent No.: US 9,905,427 B2
(45) Date of Patent: Feb. 27, 2018

(54) LASER ANNEALING DEVICE AND LASER ANNEALING METHOD

(71) Applicant: Junji Kido, Yamagata (JP)

(72) Inventor: Junji Kido, Yamagata (JP)

( * ) Notice: Subject to any disclaimer, the term of this patent is extended or adjusted under 35 U.S.C. 154(b) by 0 days.

(21) Appl. No.: 15/500,436

(22) PCT Filed: Aug. 19, 2015

(86) PCT No.: PCT/JP2015/073200
§ 371 (c)(1),
(2) Date: Jan. 30, 2017

(87) PCT Pub. No.: WO2016/027821
PCT Pub. Date: Feb. 25, 2016

(65) Prior Publication Data
US 2017/0229307 A1   Aug. 10, 2017

(30) Foreign Application Priority Data
Aug. 20, 2014   (JP) ................... 2014-167980

(51) Int. Cl.
*H01L 21/00*   (2006.01)
*H01L 21/268*  (2006.01)
(Continued)

(52) U.S. Cl.
CPC .......... *H01L 21/268* (2013.01); *B23K 26/032* (2013.01); *H01L 22/12* (2013.01)

(58) Field of Classification Search
CPC ...... H01L 21/02675–21/02686; H01L 21/268; H01L 22/12; H01L 21/2636;
(Continued)

(56) References Cited

U.S. PATENT DOCUMENTS

| | | | |
|---|---|---|---|
| 2001/0017695 A1* | 8/2001 | Imao ............... | H01L 22/24 356/237.5 |
| 2006/0038980 A1* | 2/2006 | Naka ............... | G01N 21/65 356/73 |

(Continued)

FOREIGN PATENT DOCUMENTS

| | | |
|---|---|---|
| JP | H 10-284433 A | 10/1998 |
| JP | H 10-300662 A | 11/1998 |

(Continued)

OTHER PUBLICATIONS

International Search Report issued in PCT/JP2015/073200 dated Nov. 17, 2015 with English translation (4 pages).
(Continued)

*Primary Examiner* — Kevin M Picardat
(74) *Attorney, Agent, or Firm* — Osha Liang LLP

(57) ABSTRACT

A laser annealing device includes a laser beam source, a laser beam irradiating optical system that irradiates a treatment area of a treatment object substrate with a laser beam emitted from the laser beam source, an illumination light source that emits illumination light in a visible light region, an illumination optical system that irradiates the treatment area with light emitted from the illumination light source, and a spectral detector that detects light in the visible light region that has been reflected by the treatment area in which an annealing treatment has been performed with the laser beam, and outputs spectral characteristics of the light.

4 Claims, 4 Drawing Sheets

(51) Int. Cl.
*H01L 21/66* (2006.01)
*B23K 26/03* (2006.01)

(58) Field of Classification Search
CPC ............ H01L 2021/60105–2021/60127; H01L 31/186–31/1872; H01L 31/208
USPC ...................................................... 438/7, 16
See application file for complete search history.

(56) References Cited

U.S. PATENT DOCUMENTS

| | | | |
|---|---|---|---|
| 2010/0084744 A1* | 4/2010 | Zafiropoulo | ....... B23K 26/0608 257/618 |
| 2012/0077351 A1* | 3/2012 | Kajiyama | ......... H01L 21/02422 438/795 |
| 2013/0341310 A1* | 12/2013 | Van Der Wilt | ......... C30B 13/24 219/121.62 |

FOREIGN PATENT DOCUMENTS

| JP | 2002-176007 A | 6/2002 |
|---|---|---|
| JP | 2002-176009 A | 6/2002 |
| JP | 2010-118409 A | 5/2010 |
| JP | 2010-283073 A | 12/2010 |

OTHER PUBLICATIONS

Written Opinion of the International Searching Authority issued in PCT/JP2015/073200 dated Nov. 17, 2015 with English translation (7 pages).

\* cited by examiner

LASER ANNEALING DEVICE AND LASER ANNEALING METHOD

TECHNICAL FIELD

The present invention relates to a laser annealing device that irradiates a specific area on a substrate with a laser beam to perform an annealing treatment, and to a laser annealing method using the same.

BACKGROUND

Laser annealing is a treatment technique that causes transformation of a crystal lattice of a semiconductor or metal through thermal action by laser beam irradiation. The advantages are that only a necessary portion can be treated locally, it is possible to shorten the treatment time by annealing at a high energy density, and the like. Such laser annealing, applied for various usages, is an irreplaceable treatment technique in the high-speed manufacturing process of liquid crystal displays that have been increasing in size. For high-definition panels of thin-film-transistor (TFT) liquid-crystal displays that are currently mainstream, low-temperature polysilicon (LTPS) TFTs have been widely used. Laser annealing is used for treatment in which an amorphous silicon film in a TFT-forming area is locally irradiated with a laser beam and made into polysilicon (for example, see Patent Literature 1 below).

RELATED ART LITERATURE

Patent Literature

Patent Literature 1: Japanese Unexamined Patent Publication No. 2010-283073

SUMMARY

In a manufacturing process involving laser annealing treatment, whether or not the treatment has been performed properly needs to be confirmed after the treatment, for a stable supply of quality goods. Particularly in a manufacturing process of a TFT substrate for a liquid crystal display or organic EL display, it is demanded that polysilicon with high crystallinity be generated uniformly in all of a large number of TFT-forming areas existing on the substrate. Since the uniformity greatly affects the operational performance of the liquid crystal display or organic EL display, a process of confirming whether or not the laser annealing treatment has been performed properly in each TFT-forming area is an important process in performing quality control of the liquid crystal display or organic EL display to be manufactured.

Such a confirmation process after a laser annealing treatment has been conventionally performed by measuring the electrical characteristics of a thin-film transistor. However, in order to operate the thin-film transistor, a plurality of processes needs to be performed after the laser annealing treatment. Thus, a defective good from the laser annealing treatment is detected after passing through the plurality of processes, causing extra time and loss of material or the like.

One or more embodiments of the present invention enable a confirmation process on whether or not a laser annealing treatment has been performed properly to be performed on the spot without waiting for the last process, and to efficiently manufacture a TFT substrate accordingly.

A laser annealing device and a laser annealing method according to the present invention are provided with the following configuration.

A laser annealing device includes: a laser beam source; a laser beam irradiating optical system that irradiates a treatment area of a treatment object substrate with a laser beam emitted from the laser beam source; an illumination light source that emits illumination light in a visible light region; an illumination optical system that irradiates the treatment area with light emitted from the illumination light source; and a spectral detection part that detects light in a visible light region that has been reflected by the treatment area in which an annealing treatment has been performed with the laser beam, and outputs spectral characteristics of the light.

A laser annealing method includes: a treatment process of irradiating a treatment area of a treatment object substrate with a laser beam and subjecting the treatment area to an annealing treatment; and a confirmation process of irradiating the treatment area with illumination light in a visible light region, detecting light in a visible light region that has been reflected by the treatment area and outputting spectral characteristics of the light immediately after the annealing treatment, and confirming, with the spectral characteristics, whether or not the annealing treatment of the treatment area is performed properly.

ADVANTAGEOUS EFFECTS OF INVENTION

With the laser annealing device and the laser annealing method having such features, whether or not an annealing treatment is performed properly can be confirmed with the spectral characteristics of light in the visible light region that has been reflected by a treatment area, immediately after the annealing treatment of the treatment area. Accordingly, whether or not a laser annealing treatment has been performed properly can be confirmed concurrently while the laser annealing treatment with respect to an entire treatment object substrate is in progress, and this confirmation process can be performed efficiently in a short time. By manufacturing a TFT substrate using such a laser annealing device and a laser annealing method, the productivity of the TFT substrate can be improved.

DETAILED DESCRIPTION

Embodiments of the present invention will be described below. A laser annealing device and a laser annealing method according to one or more embodiments of the present invention includes a system or process to confirm, immediately after a laser annealing treatment has been performed, whether or not a treatment area thereof has been treated properly. The system or process is proposed on the basis of a finding that whether or not a proper treatment has been performed can be determined with the tint of an observation image of the treatment area that has been treated.

For example, for an annealing treatment in which a treatment area of an amorphous silicon film formed on a substrate is irradiated with a laser beam to locally generate polysilicon with a high crystallinity, the degree of crystallinity can be confirmed with the difference in tint through observation, under a light source (e.g., white light source) in the visible light region, of the area after the annealing treatment.

Figure 1:
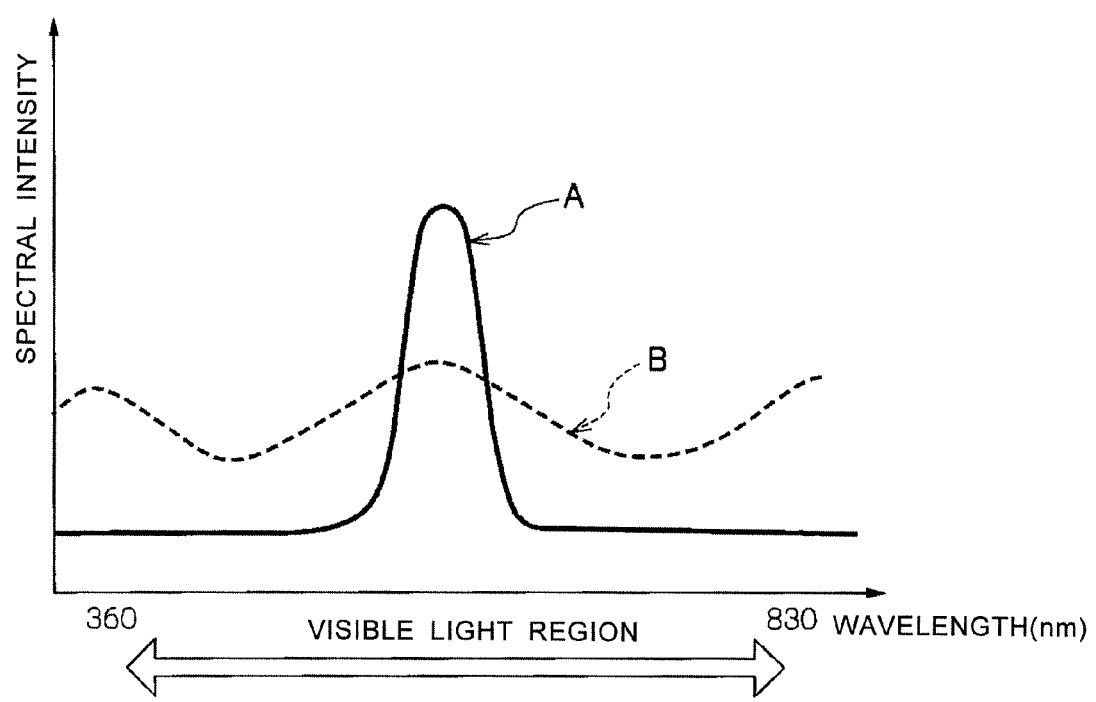
FIG. 1 is an illustrative diagram illustrating the operation principle in a laser annealing device and a laser annealing method according to one or more embodiments of the present invention.

As shown in FIG. 1, when the area after the annealing treatment is illuminated with light in the visible light region and the spectral characteristics of the reflected light is measured, spectral characteristics showing a high spectral intensity in a specific wavelength region is obtained, as shown by A in the drawing, in the case where the crystallinity is high and a proper annealing treatment has been performed. In contrast, in the case where the crystallinity is low and a proper annealing treatment has not been performed, spectral characteristics showing a high spectral intensity in a specific wavelength region is not obtained, as shown by B in the drawing. The laser annealing device and the laser annealing method according to one or more embodiments of the present invention utilizes this difference in spectral characteristics. By acquiring spectral characteristics data of reflected light obtained from illumination of a treatment area with light in the visible light region, whether or not a proper annealing treatment has been performed is confirmed.

It suffices that an object of an annealing treatment in the laser annealing method according to one or more embodiments of the present invention be a material of which reflected light from white light shows a high spectral intensity in a specific wavelength region, due to crystallization through a laser annealing treatment. Examples include a semiconductor film formed by vacuum deposition or coating (e.g., amorphous silicon formed by a vapor-phase growth method, a metal oxide semiconductor formed by a sputtering method, a thin film composed of silicon fine particles formed by coating, a thin film composed of metal oxide formed by coating, and the like). (Herein, coating includes coating with a solution in which particles are dispersed in a solvent.)

Figure 2:
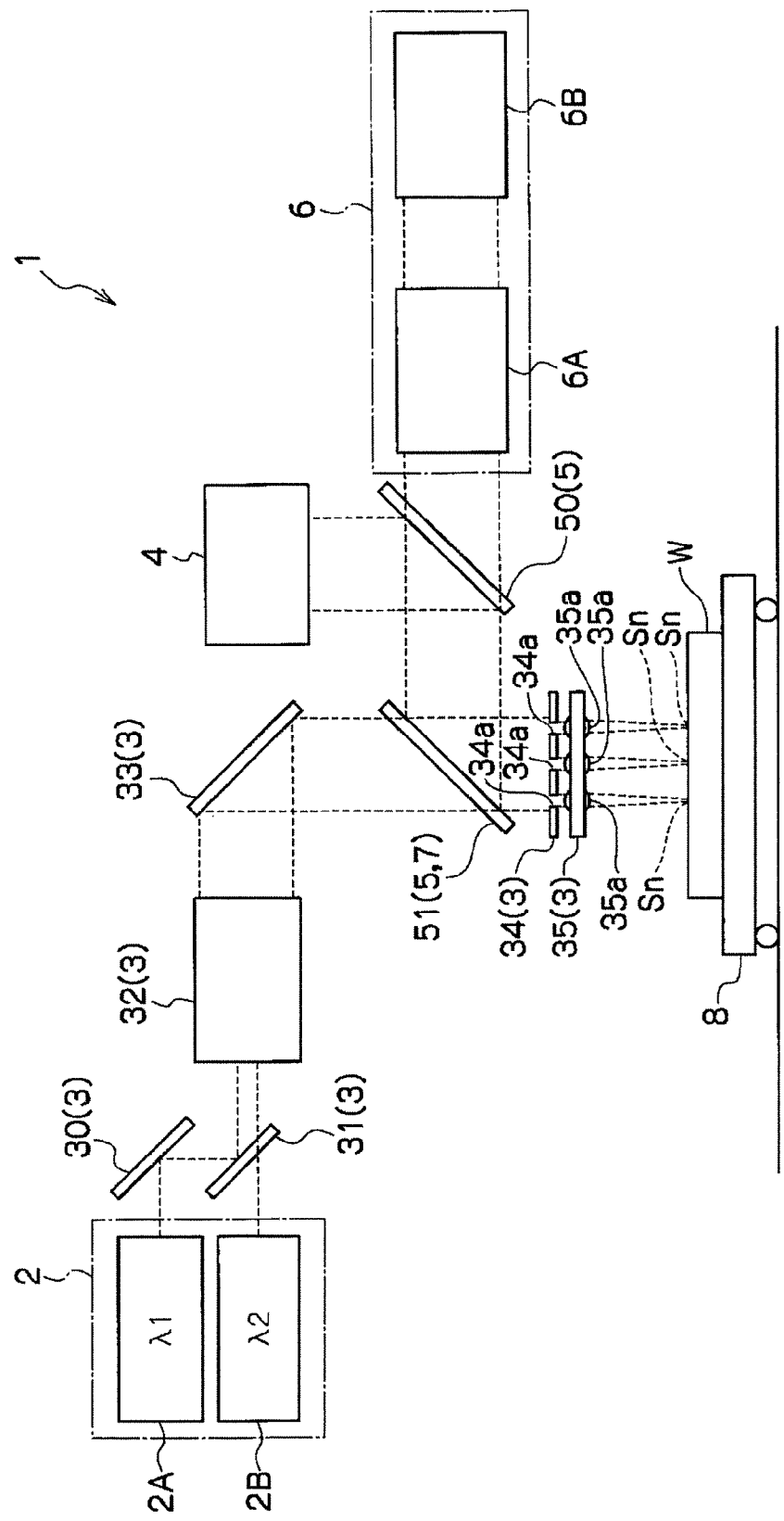
FIG. 2 is an illustrative diagram showing one example of the laser annealing device according to one or more embodiments of the present invention.
Figure 3:
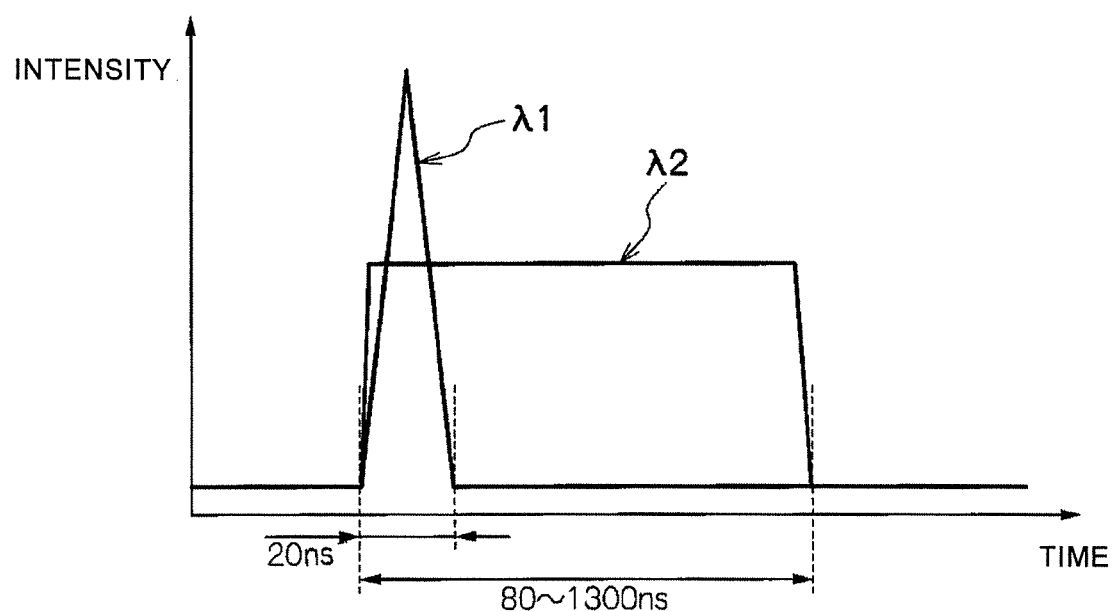
FIG. 3 is an illustrative diagram showing an output example of a laser beam source in the laser annealing device according to one or more embodiments of the present invention.

FIG. 2 shows one configuration example of the laser annealing device according to one or more embodiments of the present invention. A laser annealing device 1 includes a laser beam source 2, a laser beam irradiating optical system 3, an illumination light source 4, an illumination optical system 5, and a spectral detection part 6. The laser beam source 2 is a light source that emits a laser beam to perform a laser annealing treatment and, herein, includes a pulse laser beam source 2A with a wavelength of λ1 (which equals 532 nm) and a pulse laser beam source 2B with a wavelength of λ2 (which equals 1064 nm). For the output of the laser beam source 2, there are simultaneous outputs of the two pulse laser beam sources at a pulse interval and intensity as shown in FIG. 3, in the case of an annealing treatment of an amorphous silicon film in a TFT-forming area of a TFT substrate. Upon performing one annealing treatment with respect to one treatment area, in this example, the output of the pulse laser beam source 2A with the wavelength λ1 is caused to be an output with a relatively short pulse interval (20 ns) and a relatively high intensity, and the output of the pulse laser beam source 2B with the wavelength λ2 is caused to be an output with a relatively long pulse interval (80 to 1300 ns) and a relatively low intensity. The laser beam source 2 may be for an excimer laser to radiate a laser beam with a wavelength of 308 nm or 353 nm at a constant repetition cycle.

The laser beam irradiating optical system 3 irradiates a treatment area (e.g., TFT-forming area) Sn of a treatment object substrate (e.g., TFT substrate) W with a laser beam emitted from the laser beam source 2. In an example in the drawing, a laser beam having an increased diameter and a spatially uniform intensity is obtained by laser beams emitted from the two pulse laser beam sources 2A and 2B being synthesized with a synthesis optical system configured of a mirror 30 and a dichroic mirror 31 and entering a beam homogenizer 32. The laser beam is polarized with a mirror 33 for irradiation of the treatment object substrate W via a mask 34 and a microlens array 35. For the mask 34 and the microlens array 35 herein, an aperture 34a and a microlens 35a are aligned to correspond to a plurality of the treatment areas Sn aligned in a dot matrix pattern on the treatment object substrate W. The laser beam that has been transmitted through the aperture 34a and the microlens 35a is condensed simultaneously at each of the plurality of treatment areas Sn on the treatment object substrate W. The aperture 34a of the mask 34 and the treatment area Sn may be in a conjugate relationship (relationship of an object and an image).

The illumination light source 4 is a light source that emits illumination light in the visible light region. For example, a white light source such as a halogen lamp may be used. The illumination optical system 5 irradiates the treatment area Sn with light emitted from the illumination light source 4 for irradiation with a laser beam. Herein, the illumination optical system 5 is configured of a half mirror 50 disposed to be inclined with respect to the optical axis of light emitted from the illumination light source 4 and a half mirror 51 disposed to be inclined with respect to the optical axis of a laser beam for irradiation of the treatment area Sn.

The spectral detection part 6 includes a spectroscope 6A and a detector 6B to detect light in the visible light region that has been reflected by the treatment area Sn in which an annealing treatment has been performed with a laser beam, and output the spectral characteristics of the light. The half mirror 51 disposed to be inclined with respect to the optical axis of a laser beam for irradiation of the treatment area Sn also serves as a detection optical system 7 that guides reflected light to the spectral detection part 6.

The laser annealing device 1 including such a configuration subjects the treatment area Sn to a laser annealing treatment by irradiating the treatment area Sn of the treatment object substrate W with a laser beam emitted from the laser beam source 2, via the laser beam irradiating optical system 3. With the laser beam irradiating optical system 3 including the beam homogenizer 32, the mask 34, and the microlens array 35 as shown in the drawing, each of the plurality of treatment areas Sn of the treatment object substrate W is irradiated with a laser beam simultaneously, so that the laser annealing treatment is performed in each treatment area Sn.

The treatment area Sn irradiated with a laser beam is irradiated with illumination light emitted from the illumination light source 4, via the illumination optical system 5. Immediately after a laser annealing treatment has been performed through irradiation of the treatment area Sn with a laser beam, light in the visible light region that has been reflected by the treatment area Sn is detected by the spectral detection part 6 via the detection optical system 7. With the laser beam irradiating optical system 3 including the microlens array 35 as shown in the drawing, light in the visible light region that has been reflected by all treatment areas Sn irradiated with a laser beam via the microlens array 35 is detected by the spectral detection part 6.

With a laser annealing method using such a laser annealing device 1, immediately after a treatment process in which the treatment area Sn of the treatment object substrate W is irradiated with a laser beam and subjected to an annealing treatment, the spectral detection part 6 can detect light in the visible light region that has been reflected by the treatment area Sn and output the spectral characteristics of the reflected light. Accordingly, immediately after a treatment process in which the treatment area Sn is irradiated with a laser beam and subjected an annealing treatment, a confirmation process of confirming, with the spectral characteristics of reflected light, whether or not the annealing treatment of the treatment area Sn has been performed properly can be executed.

Since the mask 34 and the microlens array 35 are shared by the laser beam irradiating optical system 3 and the detection optical system 7, an object area of the confirmation process is identical with the treatment area Sn for a laser beam. Therefore, reflected light from an (uncrystallized) area not irradiated with the laser beam does not enter the spectral detection part. Thus, noise contamination in the spectral characteristics can be prevented without performing a special treatment in the spectral detection part, and the configuration of the device can be simplified. Further, space saving through integration of an annealing device and a detection device is made possible.

In the case where an annealing treatment is performed for each of the plurality of treatment areas Sn simultaneously via the microlens array 35 in the example shown in FIG. 2, whether or not a proper treatment has been performed in the plurality of treatment areas Sn can be confirmed collectively using the output of the spectral detection part 6, immediately after the annealing treatment of the plurality of treatment areas Sn has been performed collectively. The output of the spectral detection part 6 at this time is spectral characteristics of the plurality of treatment areas Sn as a whole in which the annealing treatment has been performed collectively, and confirmation is not made with respect to each one of the treatment areas Sn.

The laser annealing device 1 includes a treatment area scanning part 8 that scans the position of the treatment area Sn on the treatment object substrate W. In the example shown in the drawing, the treatment area scanning part 8 is moved within a two-dimensional plane intersecting with the optical axis of a laser beam for irradiation of the treatment area Sn of the treatment object substrate W. However, this is not limiting. It may be such that the treatment object substrate W is fixed, and the laser beam irradiating optical system 3 and the illumination optical system 5 are moved for scanning with respect to the treatment object substrate W with a laser beam and illumination light for irradiation of the treatment area Sn. The scanning with the treatment area scanning part 8 may be a continuous scan or may be intermittent scans in which the position of the treatment area Sn on the treatment object substrate W is shifted for every annealing treatment. By the scanning with the treatment area scanning part 8, the annealing treatment is performed as needed for the treatment areas Sn disposed on the entire treatment object substrate W.

Figure 4:
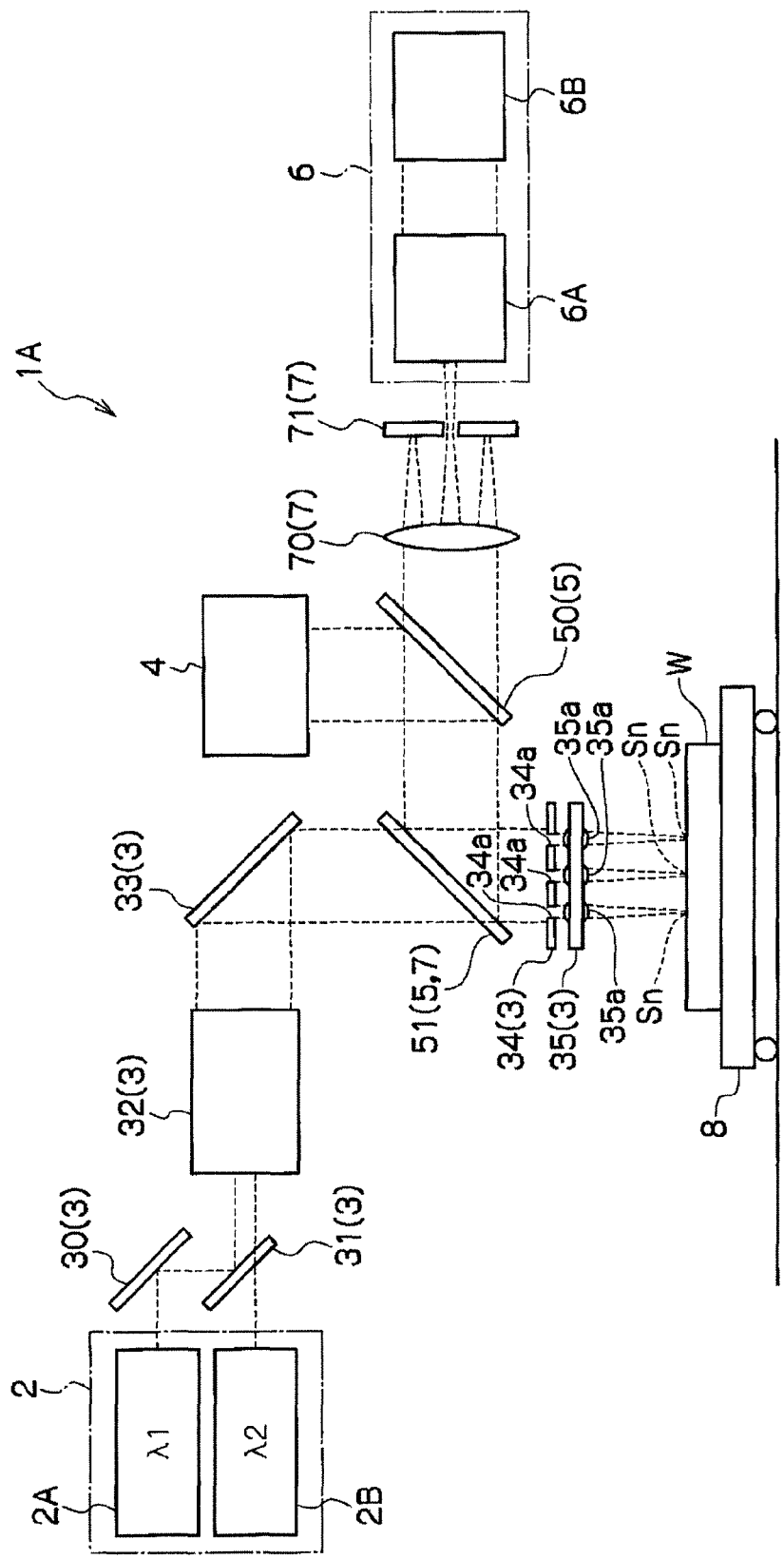
FIG. 4 is an illustrative diagram showing a different example of a laser annealing device according to one or more embodiments of the present invention.

FIG. 4 shows a laser annealing device according to one or more embodiments of the present invention. Portions in common with the example shown in FIG. 2 are denoted by the same reference signs, and redundant description will be omitted. A laser annealing device 1A according to this embodiment includes, in the detection optical system 7, an imaging optical system 70 and a selective light transmission part (blind) 71. In coordination with the microlens array 35, the imaging optical system 70 forms an image of the treatment area Sn of the treatment object substrate W in the front position of the spectral detection part 6 where the selective light transmission part 71 is disposed. The selective light transmission part 71 is provided with an aperture part corresponding to an image of only a specific treatment area Sn out of a plurality of formed images of the treatment areas Sn, such that reflected light is transmitted selectively.

With such a laser annealing device 1A, in a similar manner to the example shown in FIG. 2, the treatment area Sn is subjected to a laser annealing treatment by irradiating the treatment area Sn of the treatment object substrate W with a laser beam emitted from the laser beam source 2, and whether or not the annealing treatment is performed properly is confirmed by irradiating the treatment area Sn with illumination light emitted from the illumination light source 4 and detecting, with the spectral detection part 6, light in the visible light region that has been reflected by the treatment area Sn immediately after the laser annealing treatment has been performed.

At this time, in the laser annealing device 1A shown in FIG. 4, the spectral detection part 6 selectively detects light that has been reflected by a specific treatment area Sn, from light in the visible light region that has been reflected by all treatment areas Sn irradiated with a laser beam via the microlens array 35. Accordingly, even in the case where an annealing treatment is performed collectively for the plurality of treatment areas Sn via the microlens array 35, it is possible to separately confirm whether or not the annealing treatment of each treatment area Sn is performed properly.

As described above, with the laser annealing devices 1 and 1A and the laser annealing method according to one or more embodiments of the present invention, whether or not an annealing treatment is performed properly can be confirmed with the spectral characteristics of light in the visible light region that has been reflected by the treatment area Sn, immediately after the annealing treatment of the treatment area Sn has been performed. Accordingly, whether or not a laser annealing treatment has been performed properly can be confirmed concurrently while the laser annealing treatment with respect to the entire treatment object substrate W is in progress, and this confirmation process can be performed efficiently in a short time. By manufacturing a TFT substrate using such a laser annealing device 1 or 1A or laser annealing method, the productivity of the TFT substrate can be improved.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATION OF REFERENCE NUMERALS 1, 1A Laser annealing device
2 Laser beam source
2A, 2B Pulse laser beam source
3 Laser beam irradiating optical system
30, 33 Mirror
31 Dichroic mirror
32 Beam homogenizer 34 Mask
35 Microlens array
4 Illumination light source (white light source)
5 Illumination optical system
50, 51 Half mirror
6 Spectral detection part
6A Spectroscope
6B Detector
7 Detection optical system
70 Imaging optical system
71 Selective light transmission part (blind)
8 Treatment area scanning part
W Treatment object substrate
Sn Treatment area

What is claimed is:

1. A laser annealing device comprising:
a laser beam source;
a laser beam irradiating optical system that irradiates a treatment area of a treatment object substrate with a laser beam emitted from the laser beam source via a half mirror;
an illumination light source that emits illumination light in a visible light region;
an illumination optical system that irradiates the treatment area with light emitted from the illumination light source via the half mirror; and
a spectral detector that detects light in the visible light region that has been reflected by the treatment area in which an annealing treatment has been performed with the laser beam, and outputs spectral characteristics of the light,
wherein the laser beam irradiating optical system comprises a microlens array with which the laser beam is condensed at each of a plurality of treatment areas simultaneously, and
wherein the spectral detector detects light in the visible light region that has been reflected by all of the treatment areas irradiated with the laser beam via the microlens array and a detection optical system guides reflected light to the spectral detection part via the half mirror.

2. The laser annealing device according to claim 1, wherein the spectral detector selectively detects light that has been reflected by a specific treatment area, from light in the visible light region that has been reflected by all of the treatment areas irradiated with the laser beam via the microlens array.

3. The laser annealing device according to claim 2, wherein an imaging optical system that forms an image of the treatment area in a front position of the spectral detector, and a selective light transmitter that transmits only light reflected by a specific treatment area at a front position, are provided in front of the spectral detector.

4. The laser annealing device according to claim 1, comprising a treatment area scanner that scans a position of the treatment area on the treatment object substrate.

* * * * *